(12) United States Patent
Inada et al.

(10) Patent No.: US 6,730,599 B2
(45) Date of Patent: May 4, 2004

(54) FILM FORMING METHOD AND FILM FORMING APPARATUS

(75) Inventors: Hiroichi Inada, Kumamoto (JP); Shuichi Nagamine, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/339,396

(22) Filed: Jan. 10, 2003

(65) Prior Publication Data

US 2003/0099776 A1 May 29, 2003

Related U.S. Application Data

(62) Division of application No. 09/827,910, filed on Apr. 9, 2001, now Pat. No. 6,541,376.

(30) Foreign Application Priority Data

Apr. 11, 2000 (JP) .......... 2000-109028

(51) Int. Cl.$^7$ .......... H01L 21/44
(52) U.S. Cl. .......... 438/680; 438/618; 438/5; 438/7; 438/8
(58) Field of Search .......... 438/618, 680, 438/5, 7, 8; 118/666, 667, 730; 414/935, 936, 937, 938, 939, 940; 73/291, 292

(56) References Cited

U.S. PATENT DOCUMENTS

| | | | |
|---|---|---|---|
| 5,089,874 A | | 2/1992 | Deguchi et al. |
| 5,366,757 A | | 11/1994 | Lin |
| 5,449,405 A | | 9/1995 | Cardinali et al. |
| 5,452,052 A | * | 9/1995 | Takado et al. .......... 355/53 |
| 5,633,040 A | | 5/1997 | Toshima et al. |
| 5,939,130 A | | 8/1999 | Shiraishi et al. |
| 6,001,727 A | | 12/1999 | Ohmi et al. |
| 6,002,108 A | * | 12/1999 | Yoshioka .......... 219/388 |
| 6,040,118 A | | 3/2000 | Capodieci |
| 6,121,579 A | | 9/2000 | Aoki et al. |
| 6,169,274 B1 | | 1/2001 | Kulp |
| 6,291,800 B1 | | 9/2001 | Shirakawa et al. |
| 6,341,923 B1 | | 1/2002 | Niemi |
| 6,368,776 B1 | | 4/2002 | Harada et al. |

FOREIGN PATENT DOCUMENTS

JP 02001189373a 7/2002

* cited by examiner

Primary Examiner—Matthew Smith
Assistant Examiner—V. Yevsikov
(74) Attorney, Agent, or Firm—Oblon, Spivak, McClelland, Maier & Neustadt, P.C.

(57) ABSTRACT

The present invention is a film forming method of forming a film of a treatment solution on the front face of a substrate in a treatment chamber including the steps of: supplying the treatment solution to the substrate mounted on a holding member in the treatment chamber in states of gas being supplied into the treatment chamber and of an atmosphere in the treatment chamber being exhausted; and measuring the temperature of the front face of the substrate before the supply of the treatment solution. The measurement of the temperature of the front face of the substrate before the supply of the treatment solution enables the check of the temperature of the front face of the substrate and the temperature distribution. Then, the measured result is compared with a previously obtained ideal temperature distribution for the formation of a film with a uniform thickness, thereby predicting the film thickness of the film which will be formed in the following processing. Further, the treatment film is formed after the temperature measurement and the film thickness of the treatment film is evaluated, thereby storing the data to find and set so-called optimal conditions. Consequently, the temperature or the like of the treatment solution or the like can be adjusted based on the measured results and corrected to make the film thickness uniform.

7 Claims, 10 Drawing Sheets

FILM FORMING METHOD AND FILM FORMING APPARATUS

This application is a Division of application Ser. No. 09/827,910 Filed on Apr. 9, 2001, now U.S. Pat. No. 6,541,376.

BACKGROUND OF THE INVENTION

1. Field of the Invention

The present invention relates to a film forming method and a film forming apparatus for a substrate.

2. Description of the Related Art

In a photolithography process in the semiconductor device fabrication processes, for example, a resist coating treatment in which a resist solution is applied to the front of a wafer to form a resist film, exposure processing in which the wafer is exposed in a pattern, a developing treatment in which development is performed for the exposed wafer, and the like are performed to form a predetermined circuit pattern on the wafer.

In this event, in the resist coating treatment and the developing treatment, a film forming step is performed in which a treatment solution is supplied onto the wafer to thereby form a film of the treatment solution on the wafer. For example, in the resist coating treatment, the wafer is rotated at a predetermined speed with being suction-held by a spin chuck, and the resist solution is supplied to the center of the rotated wafer, whereby the resist solution is diffused to form the resist film on the wafer.

In order to improve yields of the wafer, it is necessary to uniformly form the resist film to a predetermined thickness. The important factors for the formation are the temperature of the resist film and the humidity of an atmosphere therearound. In other words, the thickness of the resist film is influenced by the temperature of the resist solution and the humidity of the atmosphere therearound, and thus, for example, when the temperature of the resist solution is high, the resist solution vaporizes, and the film thickness correspondingly decreases. Accordingly, the temperature distribution of the resist solution on the wafer W is kept within a predetermined range, thereby improving the uniformity in thickness of the resist film.

The resist coating unit in which the aforementioned resist coating treatment, however, is not provided with a measuring device for measuring the temperature of the wafer, and thus the temperature is not been measured. When the thickness of the resist film is corrected to be uniform, an adequate temperature distribution or the like during the coating is estimated from unevenness in line width of the circuit pattern which is finally formed on the wafer to adjust the temperature and the atmosphere in the resist coating unit. As a result, it takes a long time and a great deal of labor to obtain conditions of the temperature distribution for a uniform film thickness, and, further, accuracy is not necessarily high.

SUMMARY OF THE INVENTION

The present invention is made in the viewpoints, and its object is to provide a film forming method of measuring a temperature of a substrate such as a wafer or the like and adjusting the temperature of the substrate and a humidity of an atmosphere therearound based on the result to thereby uniform the film thickness of a treatment solution and a film forming apparatus for carrying out the method.

To attain the above-described object, according to the first aspect of the present invention, the forming method of the present invention is a film forming method of forming a film of a treatment solution on a front face of a substrate in a treatment chamber, including the steps of: supplying the treatment solution to the substrate mounted on a holding member in the treatment chamber in states of gas being supplied into the treatment chamber and of an atmosphere in the treatment chamber being exhausted; and measuring a temperature of the front face of the substrate before the supply of the treatment solution.

According to the second aspect of the present invention, the forming method of the present invention is a film forming method of forming a film of a treatment solution on a front face of a substrate in a treatment chamber, including the steps of: supplying the treatment solution to the substrate mounted on a holding member in the treatment chamber in states of gas being supplied into the treatment chamber and of an atmosphere in the treatment chamber being exhausted; and measuring a temperature of the holding member before the supply of the treatment solution.

Further, the film forming apparatus of the present invention is a film forming apparatus for supplying a treatment solution to a substrate mounted on a holding member in a treatment chamber to form a film of the treatment solution on a front face of the substrate, including: a non-contact temperature measuring device for measuring at least a temperature of the front face of the substrate or the holding member.

In accordance with a result of measuring the temperature of the front face of the substrate or the temperature of the holding member, for example, the temperature of the holding member may be changed, the supply condition of the gas to the treatment chamber may be changed, the quantity of exhaust from the treatment chamber may be changed, or the supply position of the solvent vapor of the treatment solution to the substrate may be controlled. When the holding member is rotated, the rotational speed may be changed.

The measurement of the temperature of the front face of the substrate before the supply of the treatment solution enables the check of the temperature of the front face of the substrate and the temperature distribution. Then, the measured result is compared with a previously obtained ideal temperature distribution for the formation of a film with a uniform thickness, thereby predicting the film thickness of the film which will be formed in the following processing. Further, the treatment film is formed after the temperature measurement and the film thickness of the treatment film is evaluated, thereby storing the data to find and set optimal conditions. Consequently, the temperature or the like of the treatment solution or the like can be adjusted based on the measured results and corrected to make the film thickness uniform.

It is found that the temperature of the treatment solution to be supplied onto the substrate is influenced not only by the temperature of the substrate but also by the temperature of the holding member holding the substrate. The holding member of this kind in particular is often provided with a drive mechanism such as a motor and thus it is prone to accumulate heat from the motor. Accordingly, it is useful to measure the temperature of the holding member before the supply of the treatment solution to check the temperature of the holding member for the determination whether or not a uniform film will be formed.

DETAILED DESCRIPTION OF THE PREFERRED EMBODIMENT

Figure 1:
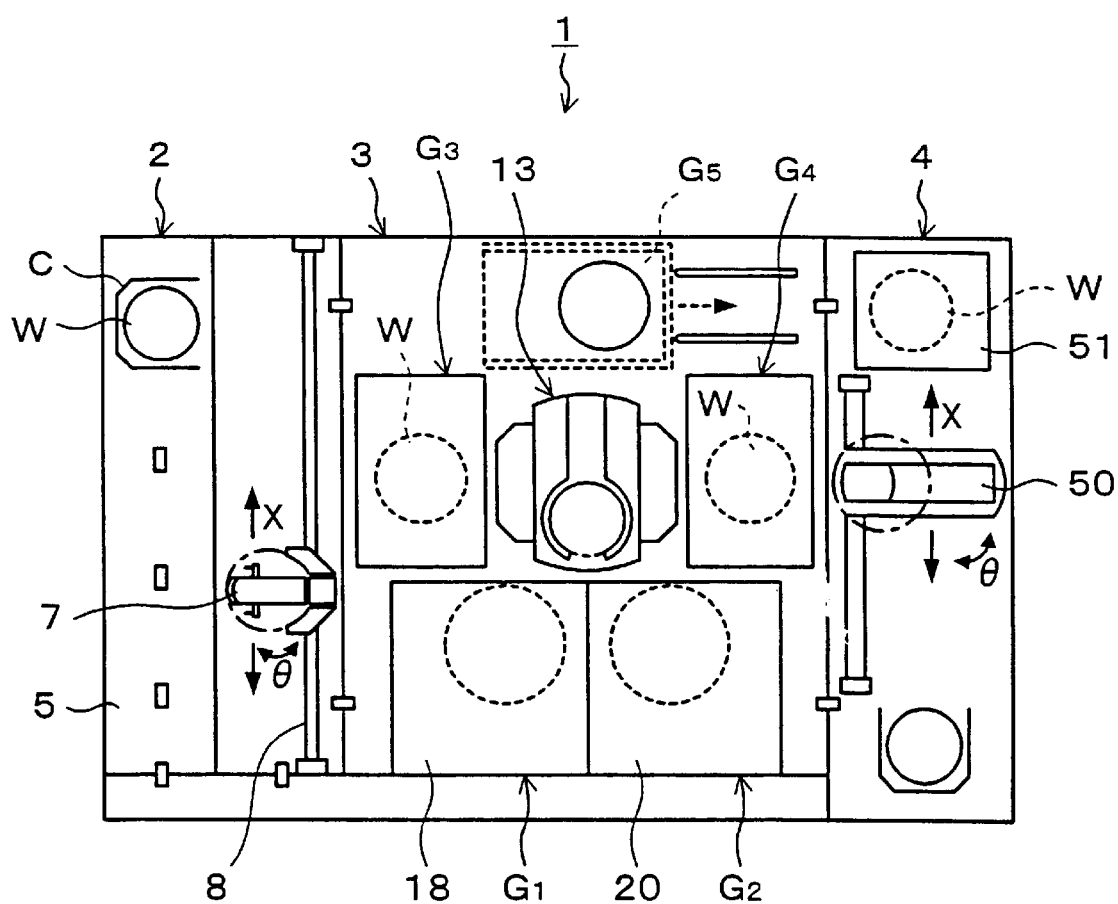
FIG. 1 is a plan view showing an appearance of the configuration of a coating and developing system in which a resist coating unit according to a first embodiment is installed.
Figure 2:
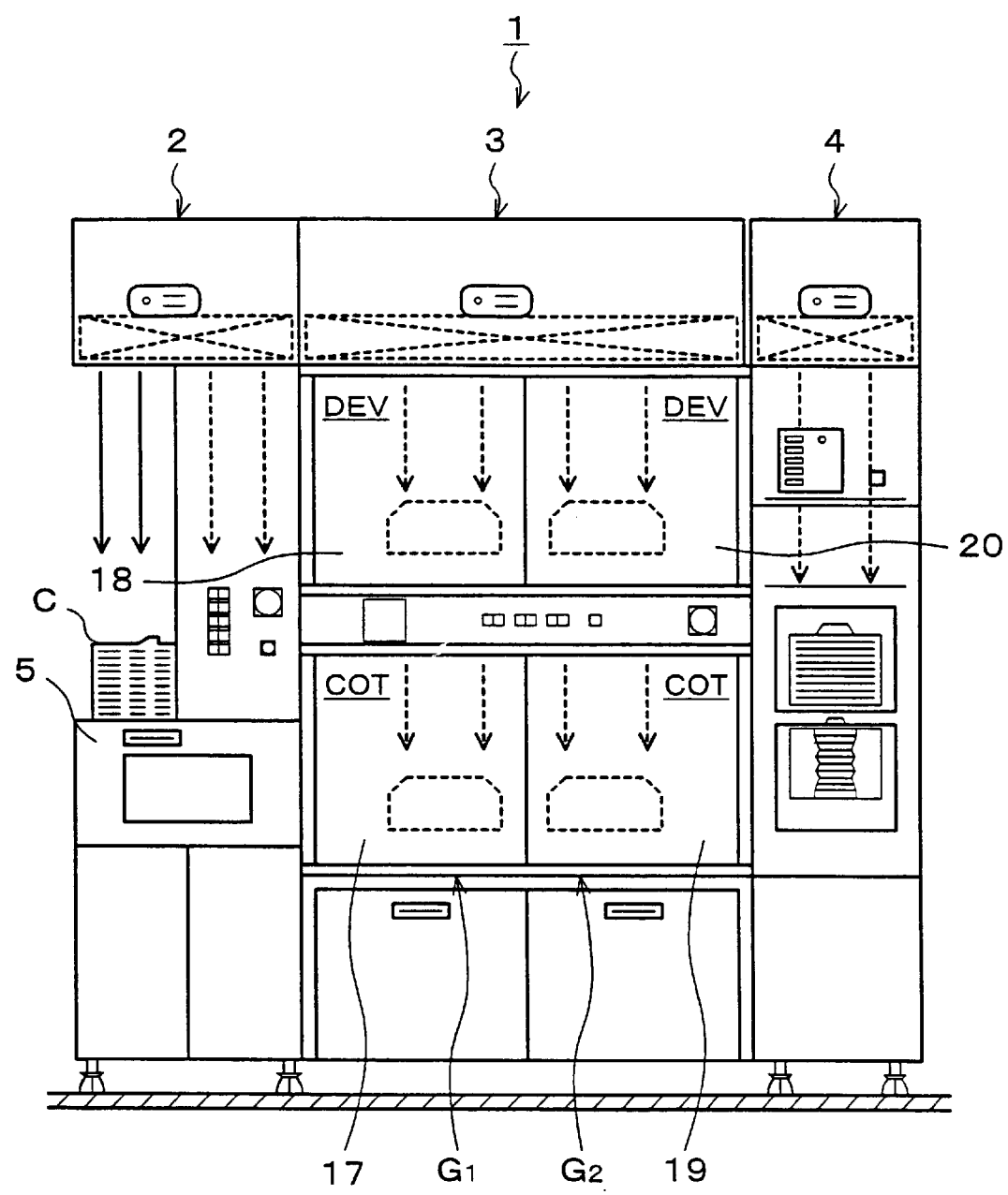
FIG. 2 is a front view of the coating and developing system in FIG. 1.
Figure 3:
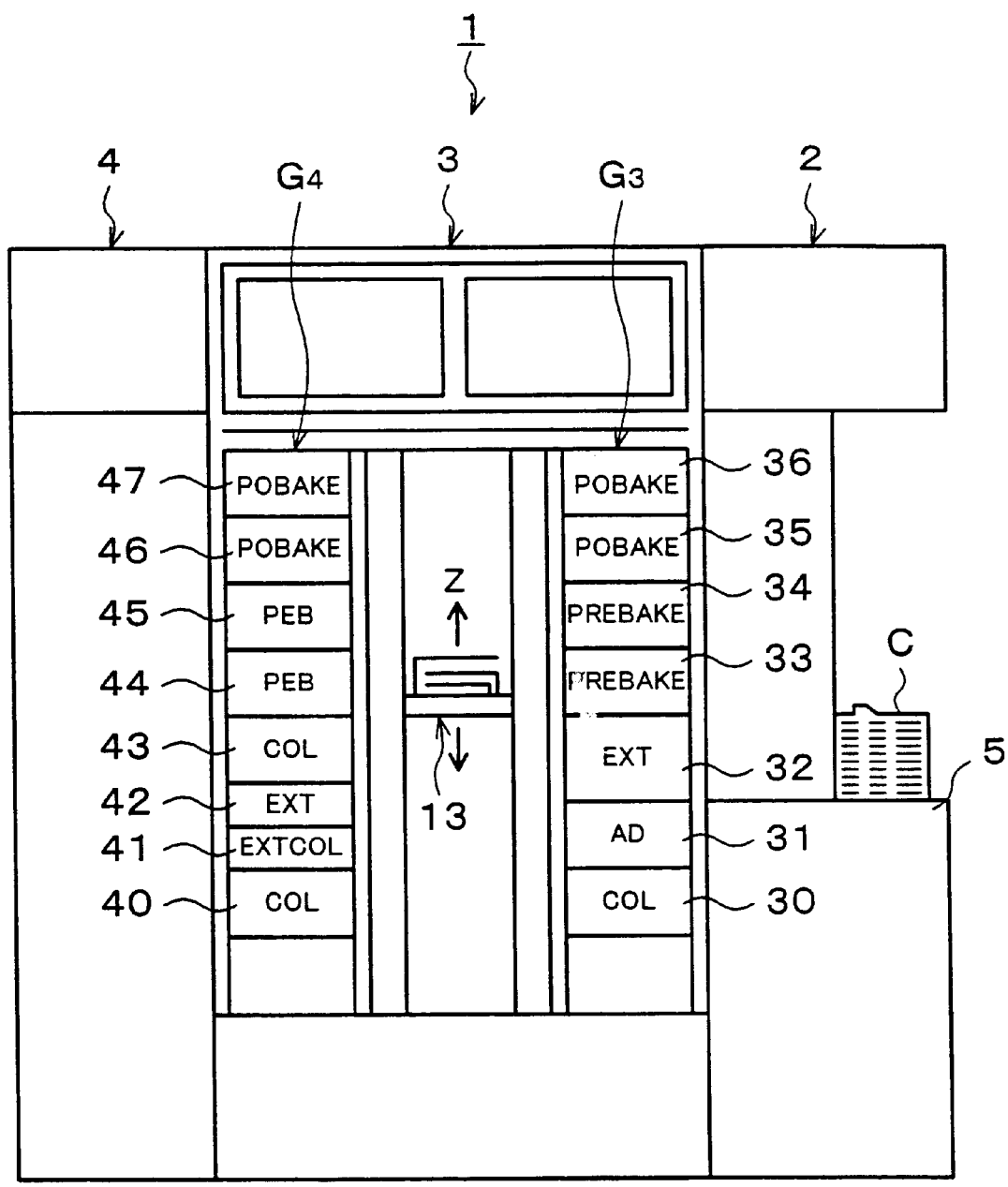
FIG. 3 is a rear view of the coating and developing system in FIG. 1.

Hereinafter, preferred embodiments of the present invention will be described. FIG. 1 is a plan view of a coating and developing system 1 including a resist coating unit according to this embodiment, FIG. 2 is a front view of the coating and developing system 1, and FIG. 3 is a rear view of the coating and developing system 1.

The coating and developing system 1 has a configuration, as shown in FIG. 1, in which a cassette station 2 for carrying, for example, 25 wafers W in a cassette, as a unit, from/to the outside into/out of the coating and developing system 1 and carrying the wafer W into/out of a cassette C, a processing station 3 in which various kinds of processing and treatment units each for performing predetermined processing or treatment for the wafers W one by one in coating and developing steps are multi-tiered, and an interface section 4 for delivering the wafer W to/from an aligner, not shown, provided adjacent to the processing station 3 are integrally connected.

In the cassette station 2, a plurality of cassettes C can be mounted at predetermined positions on a cassette mounting table 5 which is a mounting portion in a line in an X-direction (a vertical direction in FIG. 1). A wafer carrier 7 transportable in the direction of arrangement of the cassettes (the X-direction) and in the direction of arrangement of the wafers W housed in the cassette C (a Z-direction; a vertical direction) is provided to be movable along a carrier guide 8 so as to selectively get access to each cassette C.

The wafer carrier 7 has an alignment function of aligning the wafer W. The wafer carrier 7 is configured to get access also to an extension unit 32 included in a third processing unit group G3 on the processing station 3 side as described later.

In the processing station 3, a main carrier unit 13 is provided at the central portion thereof, and various kinds of processing and treatment units are multi-tiered around the main carrier unit 13 to form processing unit groups. In the coating and developing system 1, four processing unit groups G1, G2, G3, and G4 are arranged, the first and second processing unit groups G1 and G2 are disposed on the front side of the coating and developing system 1, the third processing unit group G3 is disposed adjacent to the cassette station 2, and the fourth processing unit group G4 is disposed adjacent to the interface section 4. Further, a fifth processing unit group G5 shown by a broken line can be additionally disposed on the rear side as an option. The main carrier 13 can carry in/out the wafer W to/from the various kinds of processing and treatment units described later arranged in the processing unit groups G1 to G5.

In the first processing unit group G1, for example, as shown in FIG. 2, a resist coating unit 17 as a film forming apparatus according to this embodiment and a developing unit 18 for supplying a developing solution to the wafer W to thereby treat it are two-tiered in order from the bottom. In the second processing unit group G2, a resist coating unit 19 and a developing unit 20 are similarly two-tiered in order from the bottom.

In the third processing unit group G3, for example, as shown in FIG. 3, a cooling unit 30 for cooling the wafer W, an adhesion unit 31 for enhancing fixedness between the resist solution and the wafer W, an extension unit 32 for allowing the wafer to wait therein, pre-baking units 33 and 34 each for evaporating a solvent in the resist solution, post-baking units 35 and 36 each for performing heat treatment after the developing treatment, and the like are, for example, seven-tiered in order from the bottom.

In the fourth processing unit group G4, for example, a cooling unit 40, an extension and cooling unit 41 for allowing the wafer W mounted thereon to cool by itself, an extension unit 42, a cooling unit 43, postexposure baking units 44 and 45 each for performing heat treatment after exposure processing, post-baking units 46 and 47, and the like are, for example, eight-tiered in order from the bottom.

A wafer carrier 50 is provided at the canter of the interface section 4. The wafer carrier 50 is configured to be movable in the X-direction (the vertical direction in FIG. 1) and in the Z-direction (the vertical direction) and rotatable in a θ-direction (a direction of rotation around a Z-axis) so as to get access to the extension and cooling unit 41 and the extension unit 42 included in the fourth processing unit group G4, a peripheral aligner 51, and the not shown aligner.

Figure 4:
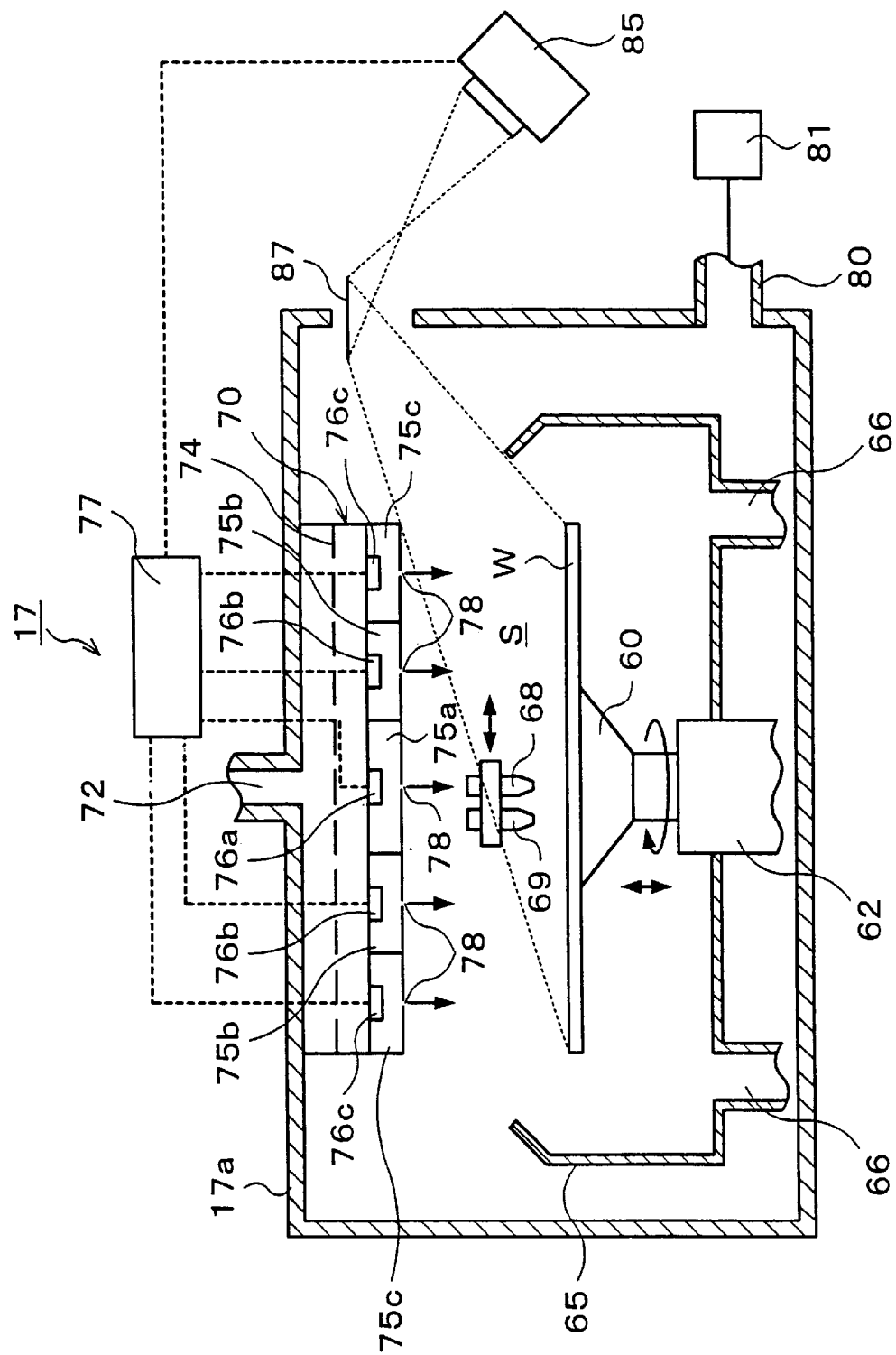
FIG. 4 is an explanatory view of a vertical cross section of a resist coating unit according to the embodiment.

The configuration of the aforementioned resist coating unit 17 will be explained. As shown in FIG. 4, a spin chuck 60 having an upper face 60a in circular and flat form and a not shown suction port at the center is provided in a casing 17a of the resist coating unit 17 such that the wafer W carried into the resist coating unit 17 is horizontally suction-held on the upper face 60a of the spin chuck 60. A rotary drive mechanism 62 for rotating the spin chuck 60 and capable of changing its rotational speed is provided below the spin chuck 60 to rotate the wafer W held on the spin chuck 60 at an optional speed.

The rotary drive mechanism 62 of the spin chuck 60, having a function of freely moving the spin chuck 60 up and down, moves the spin chuck 60 up and down when the wafer W is carried in/out to deliver the wafer W to/from the main carrier 13.

An annular cup 65 with an upper face opened is provided outside the outer periphery of the spin chuck 60 to surround the outer periphery so as to receive the resist solution and the like dropping by centrifugal force off the wafer W which is suction-held on the spin chuck 60 and rotated, thereby preventing the units therearound from being contaminated. A drain pipe 66 for draining the resist solution and the like dropping off the wafer W and the like is provided at the bottom of the cup 65.

A discharge nozzle 68 for discharging the resist solution to the wafer W and a solvent discharge nozzle 69 for discharging a solvent of the resist solution to the wafer W are provided above the spin chuck 60. The discharge nozzle 68 is movable to a position above the center of the wafer W. Accordingly, the resist solution is discharged from the discharge nozzle 68 to the center of the wafer W which is being rotated by the above-described rotary drive mechanism 62, so that a predetermined resist film is formed on the wafer W by a so-called spin coating method.

A gas supply means 70 for supplying a treatment chamber S with a predetermined gas, for example, clean air to thereby control an atmosphere in the treatment chamber S is provided at the upper face of the casing 17a. The gas supply means 70 is formed to be almost cylindrical as a whole, and its upper face is provided with a main supply port 72 for allowing the clean air from the outside of the casing 17a to flow thereinto.

Figure 5:
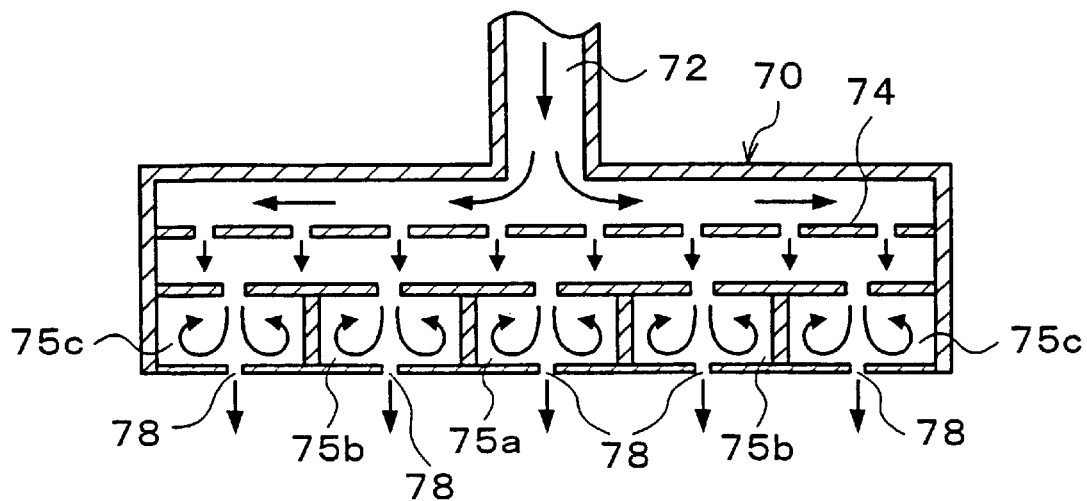
FIG. 5 is an explanatory view of a vertical cross section of a gas supply means in the resist coating unit shown in FIG. 4.
Figure 6:
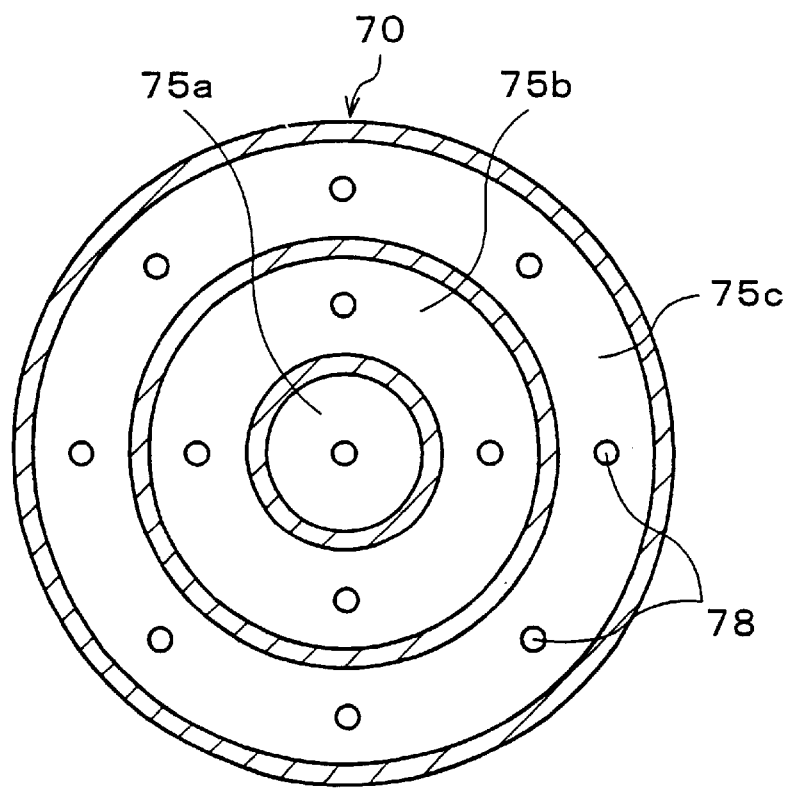
FIG. 6 is an explanatory view of a horizontal cross section of the gas supply means shown in FIG. 5.

As shown in FIG. 4 and FIG. 5, diffuser panels 74 for diffusing the clean air from the main supply port 72 are horizontally provided in the gas supply means 70. Further, on the wafer W side of the diffuser panels 74, a plurality of temperature adjusting chambers 75a, 75b and 75c are provided to which the clean air passing through the diffuser panels 74 is distributed and individually adjusted in temperature. The temperature adjusting chambers 75a, 75b and 75c, as shown in FIG. 6, are concentrically divided and opposed to the position of the wafer W located thereunder. Further, as shown in FIG. 4, heating and cooling means 76a, 76b and 76c such as Peltier elements are provided in the temperature adjusting chambers 75a, 75b and 75c respectively to, change temperatures in the temperature adjusting chambers 75a, 75b and 75c, and by extension, to be able to change temperature of the clean air within each chamber. Incidentally, the temperatures of the heating and cooling means 76a, 76b and 76c are controlled by a temperature controller 77. Furthermore, a plurality of supply ports 78 are provided at the lower faces of the temperature adjusting chambers 75a, 75b and 75c, that is, at the lower face of the gas supply means, and formed so as to jet toward the upper face of the wafer W the clean air which is temperature-adjusted in each of the temperature adjusting chambers 75a, 75b and 75c. It should be noted that an inert gas such as nitrogen gas or the like may be used as a gas for controlling the atmosphere in the treatment chamber S.

An exhaust port 80 for exhausting the atmosphere in the treatment chamber S is provided at the side face of the casing 17a. The atmosphere in the treatment chamber S is exhausted from the exhaust port 80 by suction of a suction device 81.

A thermo viewer 85 which is a thermal infrared measuring device for measuring by infrared rays the temperature of the wafer W which is an object to be measured is installed outside and at the side of the casing 17a so as to indirectly measure the temperature of the wafer W via a reflector 87 which is provided at a preferable position of the casing 17a. A measured result of the thermo viewer 85 is sent to the aforementioned temperature controller 77, and, further, the temperature controller 77 is configured to individually control the temperatures of the temperature adjusting chambers 75a, 75b and 75c based on the received data.

The operation of the resist coating unit 17 structured as described above will be explained next with the photolithography process which is performed in the coating and developing system 1.

First, one unprocessed wafer W is taken out of the cassette C by the wafer carrier 7 and carried into the adhesion unit 31 included in the third processing unit group G3, where, for example, HMDS which enhances the adhesion of the resist solution is applied to the front face of the wafer W. Then, the wafer W is carried by the main carrier unit 13 to the cooling unit 30 and cooled to a predetermined temperature. Thereafter, the wafer W is carried to the resist coating unit 17 or 19 as the film forming unit.

The wafer W which is formed with a resist film in the resist coating unit 17 or 19 is carried by the main carrier unit 13 to the pre-baking unit 33 or 34 and the cooling unit 40 in sequence. Thereafter, the wafer W is subjected to predetermined processing such as exposure processing, developing treatment and the like in the processing units, thereby completing a series of coating and developing treatments.

The operation of the above-described resist coating unit 17 will be explained in detail. First, the inside of the treatment chamber S is adjusted to a predetermined atmosphere and maintained by a gas, for example, clean air, maintained at a predetermined temperature, for example, 23° C. which is supplied from the gas supply means 70. In this event, the atmosphere in the treatment chamber S is being exhausted at any time from the exhaust port 80, whereby a flow of the clean air flowing from the gas supply means 70 toward the exhaust port 80 is formed in the treatment chamber S.

When the coating treatment of the resist solution is started, the wafer W for which previous processing has been completed is carried into the treatment chamber S by the main carrier unit 13 and stopped at a predetermined position above the spin chuck 60. Then, the main carrier unit 13 descends with holding the wafer W, and the wafer W is mounted on the spin chuck 60 which has previously ascended by the rotary drive mechanism 62 and waited and then suction-held by the spin chuck 60. Then, the spin chuck 60 descends and stops at a predetermined position in the cup 65.

Figure 7:
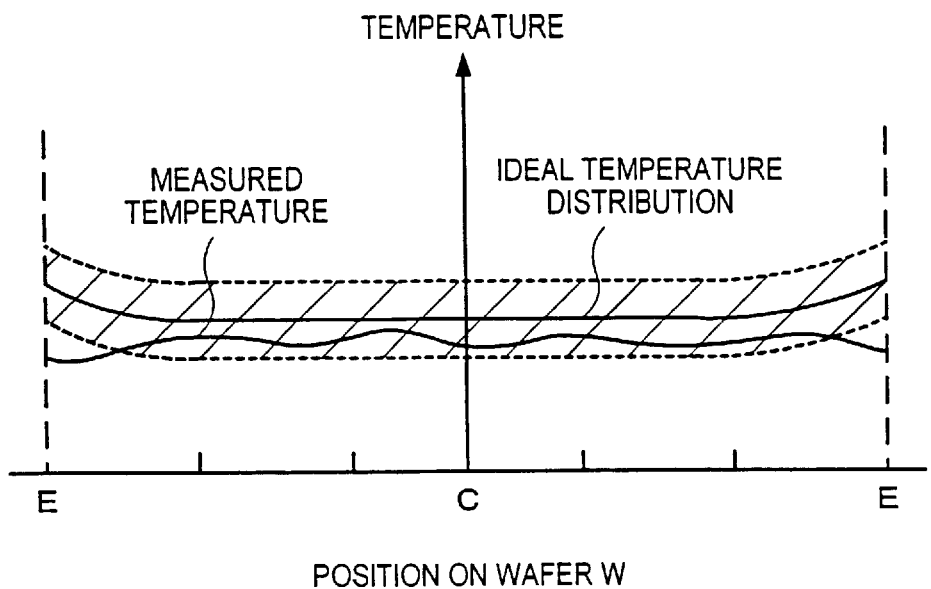
FIG. 7 is an explanatory view showing an example a measured temperature distribution on a wafer and an ideal temperature distribution.

Subsequently, the temperature of the entire front face of the wafer W is measured by the thermo viewer 85. Then, the measured data is compared with a data, for example, a temperature distribution on the wafer W as shown in FIG. 7, which has been previously obtained to form a uniform resist film over the wafer W. When there is a portion of which the measured temperature deviates from an allowable range (a diagonally shaded range in FIG. 7) with respect to an ideal temperature distribution, the data is sent to the temperature controller 77.

Thereafter, the coating treatment of the resist solution to the wafer W is started by the aforementioned so-called spin coating method. At the same time, the temperature of the temperature adjusting chamber 75 which is opposed to the deviating portion of the wafer W is adjusted based on the data which has been previously sent to the temperature controller 77, thereby adjusting the temperature of the clean air passing through the aforesaid temperature adjusting chamber 75, and, further, the clean air is supplied to the deviating portion of the wafer W, thereby correcting the temperature of the deviating portion on the wafer W.

Figure 8:
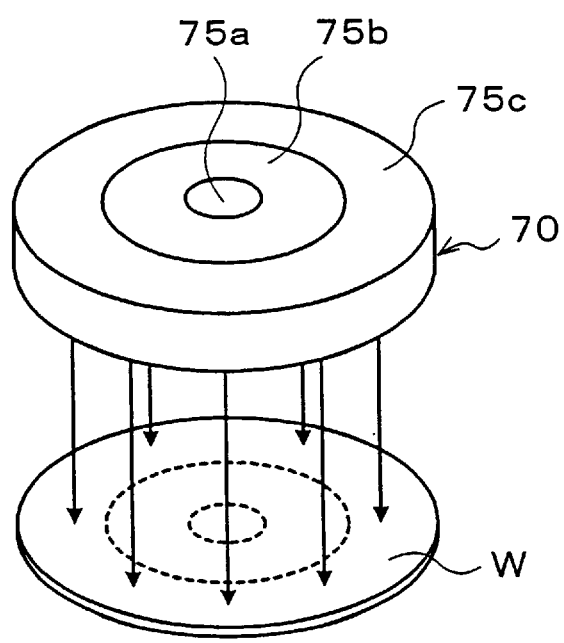
FIG. 8 is an explanatory view showing a state in which gas is supplied from the gas supply means in FIG. 4 onto the wafer.

For example, when the temperature of the outer peripheral portion of the wafer W is low as shown in FIG. 7, the temperature controller 77 raises the temperature in the temperature adjusting chamber 75c which supplies the clean air toward the outer peripheral portion of the wafer W by, for example, 2° C. This raises the temperature of the clean air passing through the temperature adjusting chamber 75c, and when the clean air is supplied from the supply ports 78 to the peripheral portion of the wafer W as shown in FIG. 8, the temperature of the peripheral portion of the wafer W rises, correcting the temperature distribution on the wafer W.

The wafer W on the spin chuck 60 is rotated rapidly, at a predetermined speed, for example, 2000 rpm by the rotary drive mechanism 62 while nitrogen gas for correcting the temperature on the wafer W is being supplied. The solvent discharge nozzle 69 located above the center of the wafer W first supplies a predetermined solvent to apply the solvent onto the front face of the wafer W. Then, the discharge nozzle 68 discharges the resist solution, and the resist solution is diffused over the front face of the wafer W by rotation of the wafer W. Thereafter, the rotation speed is increased, for example, to 3500 rpm, thereby shaking off an excessive resist solution to form a resist film with a predetermined thickness and a uniform thickness on the wafer W. Finally, the rotation of the wafer W is stopped, completing the resist coating treatment of forming the resist film on the wafer W. It should be noted that concurrently with the stop of the rotation of the wafer W, the temperature of the temperature adjusting chamber 75c is returned to the same temperature as that of the others, for example, 23° C.

Thereafter, the wafer W is lifted again by the rotary drive mechanism 62 and delivered to the main carrier unit 13, and then it is carried out of the resist coating unit 17.

According to the above embodiment, the temperature on the wafer W which exerts on the thickness of the resist film can be adjusted to a previously obtained temperature distribution within a predetermined range to uniformly form a resist film based on the measured value of the temperature on the wafer W, so that a uniform resist film can be formed by the spin coating method.

Further, since the temperature on the wafer W is indirectly measured through the use of the reflector 87, the position of the thermo viewer 85 can be set at the side of the casing 17a to thereby keep the height of the resist coating unit itself low. Incidentally, there also is a case in which it is not necessary to consider the height, wherein the temperature on the wafer W may be directly measured without using the reflector 87.

In the above-described embodiment, the temperature of the clean air from the supply ports 78 of the gas supply means 70 is changed to thereby change the film thickness of the resist film, but humidity or a supply direction of the clean air may be changed in place of the temperature.

Although the temperature of the clean air and the supply position thereof are changed based on the measured result of the thermo viewer 85 in the above-described embodiment, for example, a solvent vapor which can change the atmosphere on the wafer W, for example, temperature and humidity may be supplied onto the wafer W. This case will be explained hereafter as a second embodiment.

Figure 9:
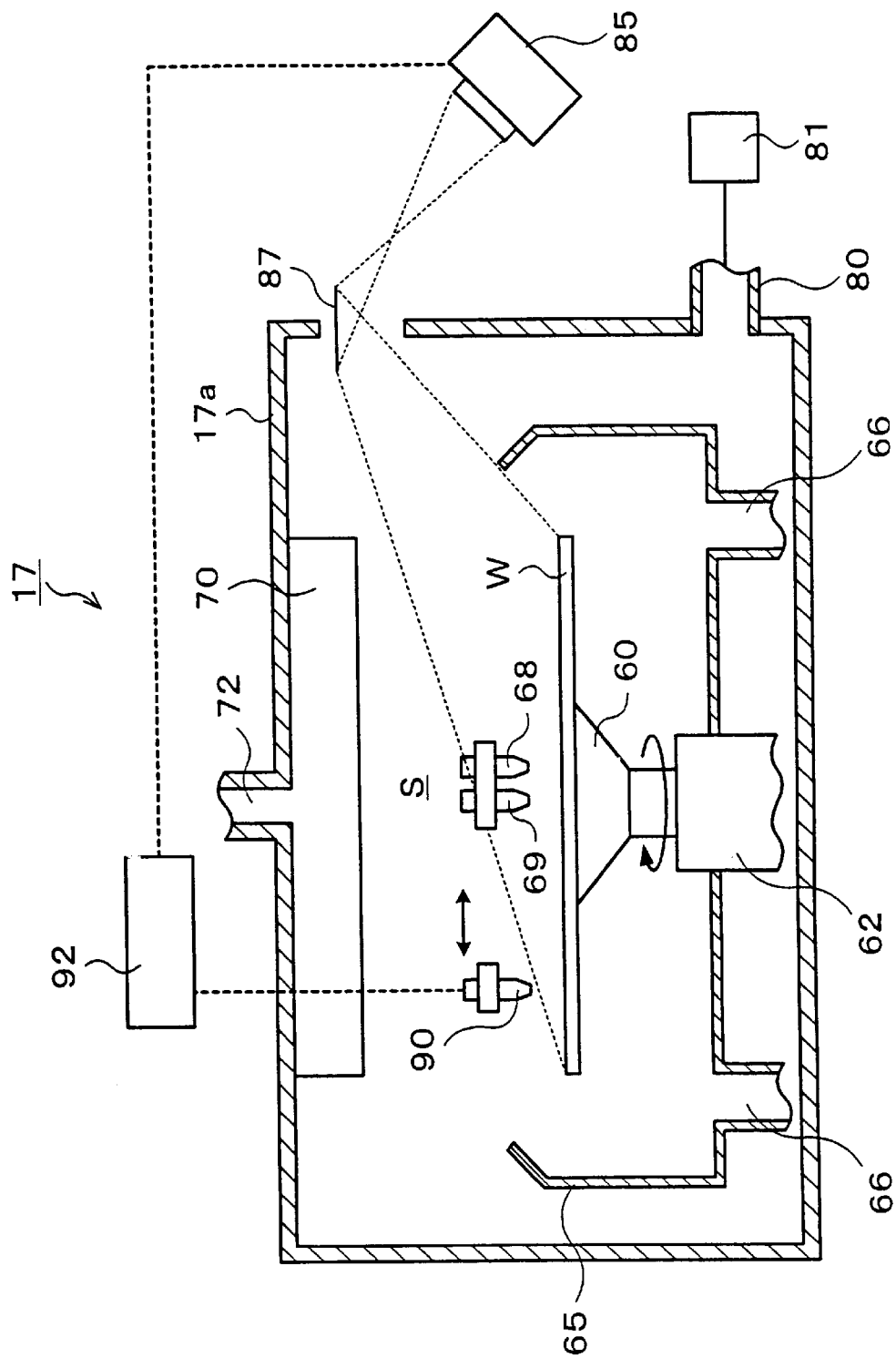
FIG. 9 is an explanatory view of a vertical cross section of a resist coating unit according to a second embodiment.

In the configuration of the resist coating unit 17 according to the second embodiment, as shown in FIG. 9, a solvent vapor discharge nozzle 90 which is horizontally movable is provided above the wafer W. Moreover, a nozzle controller 92 for controlling the discharge timing and horizontal movement of the solvent vapor discharge nozzle 90 is provided so that the data is sent from the thermo viewer 85 to the nozzle controller 92.

Then, the wafer W is mounted on the spin chuck 60, and the temperature on the wafer W is measured by the thermo viewer 85 as in the first embodiment and compared with the aforementioned ideal temperature distribution. When there is a portion which deviates from the allowable range, the data of the position and temperature of the deviating portion is sent to the nozzle controller 92. Based on the data, the position of the solvent vapor discharge nozzle 90 is moved and a predetermined solvent vapor, for example, a thinner is jetted to the deviating portion on the wafer W at a predetermined timing, for example, simultaneously with the resist solution being supplied onto the wafer W.

This changes the temperature and humidity of the atmosphere at the deviating portion on the wafer W to change the quantity of vaporization of the resist solution, thereby correcting the thickness of the resist film to form a uniform resist film on the wafer W.

Figure 10:
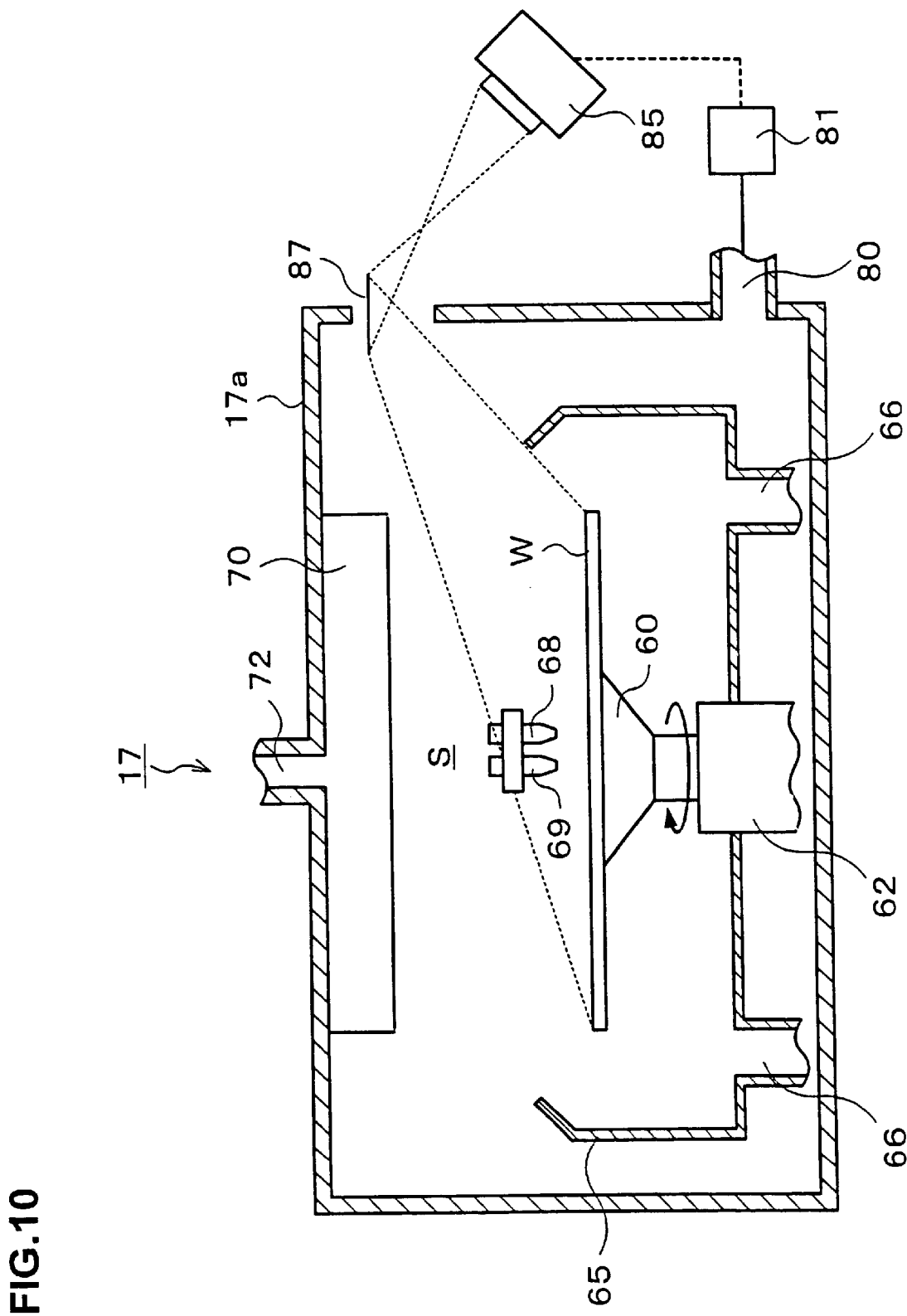
FIG. 10 is an explanatory view of a vertical cross section of a resist coating unit according to a third embodiment.

As a third embodiment, it can be suggested to change the quantity of exhaust from the exhaust port 80 based on the measured result of the thermo viewer 85. In this case, the thermo viewer 85, which is configured to be able to send its data to the suction device 81 as shown in FIG. 10, compares the measured result with the previously obtained ideal temperature distribution as in the above-described first embodiment and sends the data only when correction is necessary to change the quantity of exhaust from the exhaust port 80 based on the data. Thereby, the atmosphere near the peripheral portion of the wafer W is exhausted more than in the other portion, changing the humidity of the peripheral portion of the wafer W, thereby changing the quantity of vaporization of the resist solution from the peripheral portion of the wafer W. As a result, the thickness of the resist film is adjusted to thereby form a predetermined uniform resist film.

Figure 11:
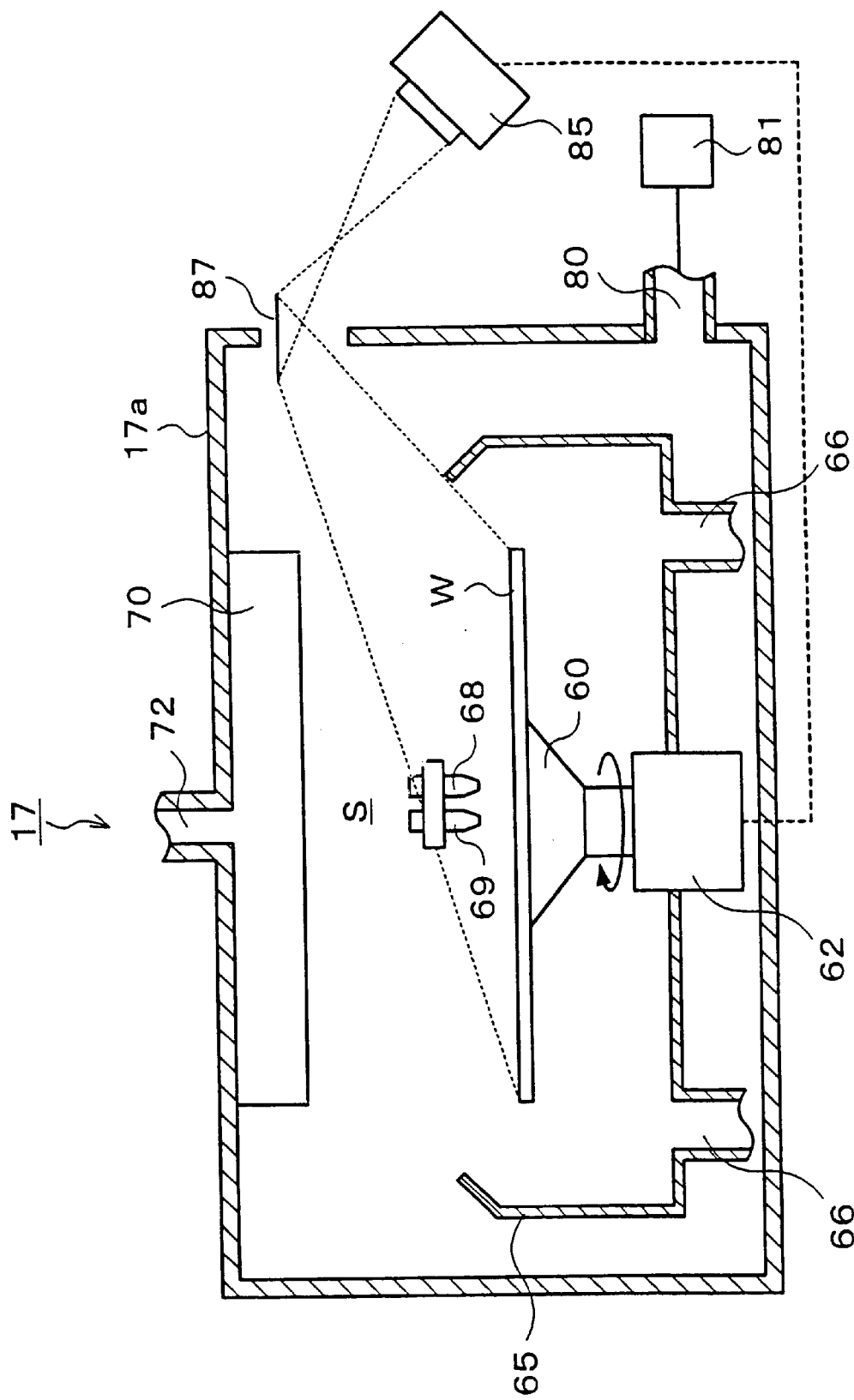
FIG. 11 is an explanatory view of a vertical cross section of a resist coating unit according to a fourth embodiment.

Further, as a fourth embodiment, it can be suggested to change the rotational speed of the spin chuck 60 based on the measured result of the thermo viewer 85. In this case, the thermo viewer 85, which is configured to be able to send its data to the rotary drive mechanism 62 as shown in FIG. 11, compares the measured result with the previously obtained ideal temperature distribution as in the above-described first embodiment and sends the data to the rotary drive mechanism 62 only when correction is necessary to change the rotational speed based on the data. This increases or decreases the quantity of vaporization on the wafer W to correct the thickness of the resist film, thereby forming a predetermined uniform resist film.

The fourth embodiment is applicable not only to the case of forming the resist film on the wafer W in the resist coating treatment but also to the case of forming a solution film of the developing solution on the wafer W in the developing treatment. Especially in the developing treatment, the developing treatment is normally performed by first forming a thin film of the developing solution or pure water on the wafer W and then completely supplying and building up the developing solution on the wafer W, and the rotational speed of the wafer W when the thin film is formed thereon may be adjusted based on a measured value of the temperature. More specifically, prior to the supply of the developing solution, the temperature on the wafer W is measured, and the measured value is compared with a previously obtained ideal temperature distribution, so that the rotational speed is adjusted only when the measured value exceeds, for example, a certain threshold. This changes the quantity of vaporization of the developing solution on the wafer W as described above, thereby adjusting the thin film formed on the wafer W to be more uniform. Consequently, the developing treatment of the wafer W is uniformly performed within the wafer W. The temperature of the front face of the wafer W mounted on the spin chuck 60 is measured in the above-described embodiments, and in addition to that, the temperature of the upper face 60a of the spin chuck 60 which is the holding member may be measured, for example, by the thermo viewer 85 prior to the mounting of the wafer W. This is because heat such as frictional heat and the like is often accumulated in the spin chuck 60 gradually while many wafers W are processed to increase the temperature of the spin chuck 60, and the increase in temperature of the spin chuck 60 leads to an increase in temperature of the wafer W mounted thereon.

Figure 12:
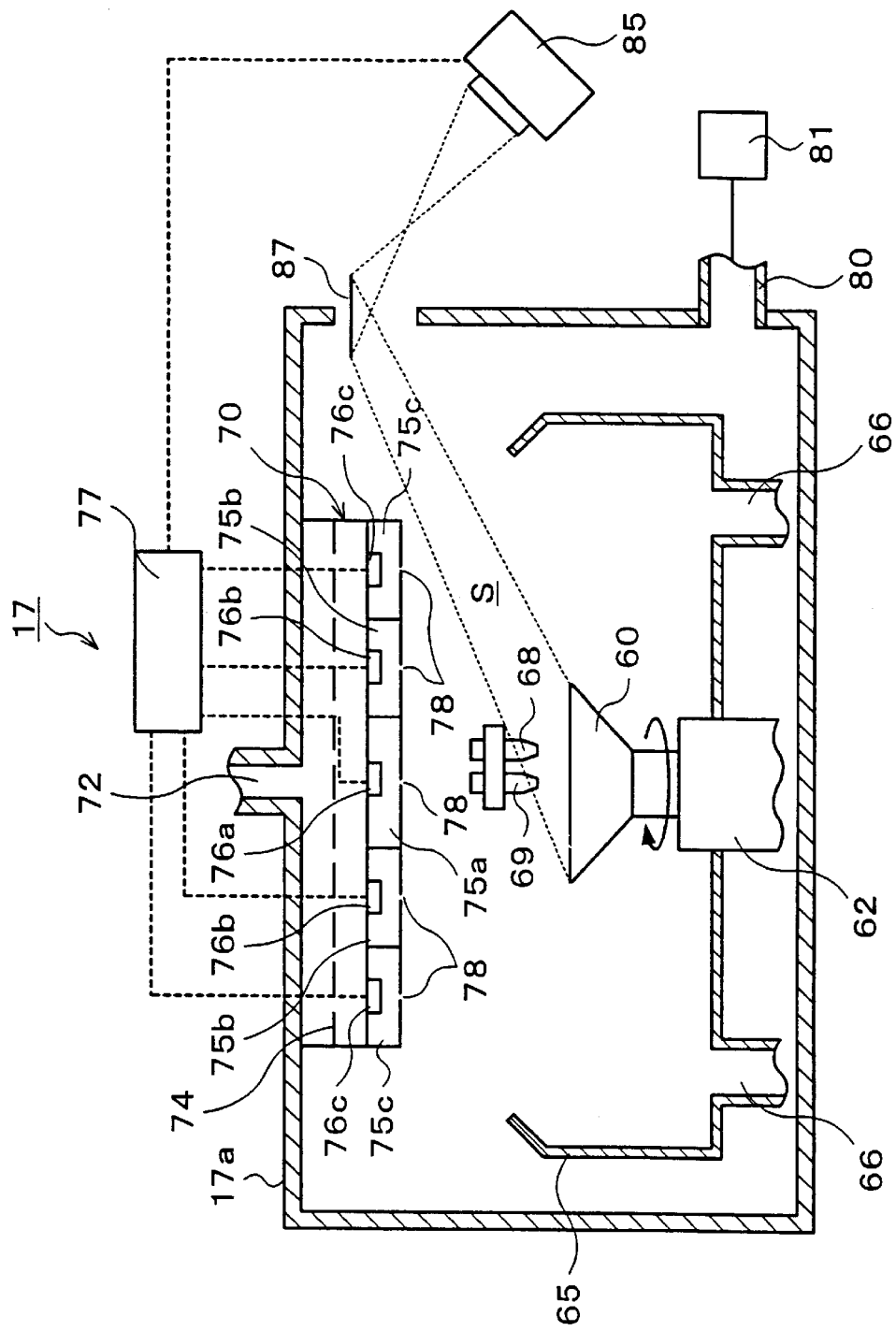
FIG. 12 is an explanatory view of a vertical cross section showing an example of a resist coating unit according to the embodiment in a case in which the temperature of an upper face of a spin chuck is measured.

Then, the temperature of the spin chuck 60 is adjusted based on the aforesaid measured result, and the adjusting means for that may employ any means described in the first to the fourth embodiment. For example, the gas supply means 70 may be used to adjust the temperature of the spin chuck 60 as shown in FIG. 12.

Although the reflector 87 is used being fixed to a suitable position in the above-described embodiments, the reflector 87 may be, for example, rotated or linearly moved in the X- and Y-directions to change its position. That movement thus allows the reflector 87 to measure the temperature distribution on the entire face of the wafer W in such a manner to scan above the wafer W. Accordingly, the reflector 87 and the thermo viewer 85 can be made compact.

The case in which the spin coating method of rotating the wafer W is used when supplying the resist solution to the wafer W is described in the above-described embodiments. The embodiments are applicable to the case of employing another method of not rotating the wafer W, for example, a method of forming a resist film or another treatment film on the wafer W by supplying the resist solution or the like while a supply means of the resist solution or another treatment solution is being moved above the wafer W.

The above-described embodiments are for the film forming apparatus for applying the resist solution to the wafer W to form the resist film, but the present invention is applicable to another film forming apparatus for an insulating film, for example, an SOD, SOG film forming apparatus, and further to a developing treatment apparatus for forming a solution film of the developing solution on the wafer W. Furthermore, the apparatus can be applied to a film forming apparatus for a substrate other than the wafer W, for example, an LCD substrate.

According to the present invention, the temperature of the substrate or the holding member is measured, and the temperature, the humidity, or the like on the substrate is corrected based on the measured value, whereby a film can be formed more uniformly on the substrate, resulting in improved yields. In the case where the temperature of the substrate is measured before the supply of the treatment solution, its processing environment is corrected individually for each substrate based on the measured result, thereby preferably performing the film forming processing of the substrate.

The employment of a non-contact temperature measuring device or a thermal infrared measuring device as the temperature measuring device eliminates the necessity of provision of the temperature measuring device directly on the substrate and enables non-contact measurement. Especially when the substrate is processed being rotated, non-contact in terms of eccentricity of the substrate, the cutting of electric line or the like, is a great advantage.

What is claimed is:

1. A film forming apparatus for supplying a treatment solution to a substrate mounted on a holding member in a treatment chamber to form a film of the treatment solution on a front face of the substrate, comprising;

a non-contact temperature measuring device for measuring at least a temperature of the front face of the substrate or the holding member.

2. An apparatus as set forth in claim 1, wherein the non-contact temperature measuring device is a thermal infrared measuring device, and wherein a reflector for reflecting an infrared ray from an object to be measured to the thermal infrared measuring device is provided.

3. An apparatus as set forth in claim 1, further comprising:

exhaust means for exhausting an atmosphere in the treatment chamber; and a controller for controlling a quantity of exhaust of the atmosphere by the exhaust means based on a measured result by the non-contact temperature measuring device.

4. An apparatus as set forth in claim 1, further comprising:

solvent vapor supply means capable of supplying a solvent vapor of the treatment solution to an optional position on the substrate; and a controller for controlling a supply position of the solvent vapor by the solvent vapor supply means based on a measured result by the non-contact temperature measuring device.

5. An apparatus as set forth in claim 1, further comprising:

a rotary drive mechanism for rotating the holding member and capable of changing a rotational speed thereof; and a controller for controlling the rotary drive mechanism based on a measured result by the non-contact temperature measuring device.

6. An apparatus as set forth in claim 1, further comprising:

gas supply means for supplying a gas into the treatment chamber; and a controller for controlling at least a temperature, a humidity, or a supply direction of the gas from the gas supply means based on a measured result by the non-contact temperature measuring device.

7. An apparatus as set forth in claim 6, wherein the gas supply means includes a plurality of supply ports provided above the substrate and directed to the substrate, and wherein at least the temperature, the humidity, or the supply direction of the supplied gas is controlled for each of the supply ports.

* * * * *